United States Patent [19]
Ciraula et al.

[11] Patent Number: 5,892,372
[45] Date of Patent: Apr. 6, 1999

[54] CREATING INVERSIONS IN RIPPLE DOMINO LOGIC

[75] Inventors: Michael Kevin Ciraula, Round Rock; George McNeil Lattimore, Austin; Robert Paul Masleid, Austin; Donald George Mikan, Jr., Austin, all of Tex.

[73] Assignee: International Business Machines Corporation, Armonk, N.Y.

[21] Appl. No.: 790,262

[22] Filed: Jan. 27, 1997

[51] Int. Cl.[6] .................................................. H03K 19/096
[52] U.S. Cl. .................................. 326/96; 326/121; 326/83
[58] Field of Search ........................... 326/83, 86, 95–98, 326/119, 121

[56] References Cited

U.S. PATENT DOCUMENTS

| | | | |
|---|---|---|---|
| 4,896,057 | 1/1990 | Yang et al. ............................ | 307/448 |
| 5,015,882 | 5/1991 | Houston et al. ....................... | 307/452 |
| 5,402,012 | 3/1995 | Thomas ................................. | 326/97 |
| 5,483,181 | 1/1996 | D'Souza ............................... | 326/98 |
| 5,504,441 | 4/1996 | Sigal .................................... | 326/93 |
| 5,550,490 | 8/1996 | Durham et al. ........................ | 326/98 |
| 5,638,008 | 6/1997 | Rangasayee et al. .................. | 326/93 |
| 5,675,263 | 10/1997 | Gabara ................................. | 326/97 |

*Primary Examiner*—Jon Santamauro
*Assistant Examiner*—Don Phu Le
*Attorney, Agent, or Firm*—Anthony V. S. England

[57] ABSTRACT

A method and implementing structures for a domino block circuit configuration includes a plurality of domino logic blocks including inverter circuits to provide inverted signals which are needed for a comprehensive logic analysis and processing. A plurality of clocking signals are applied at various clocking inputs throughout the circuit. The clocking signals are timed relative to each other in a timing sequence to assure that the logic circuit evaluations occur only after relevant data and switching signals have stabilized.

17 Claims, 3 Drawing Sheets

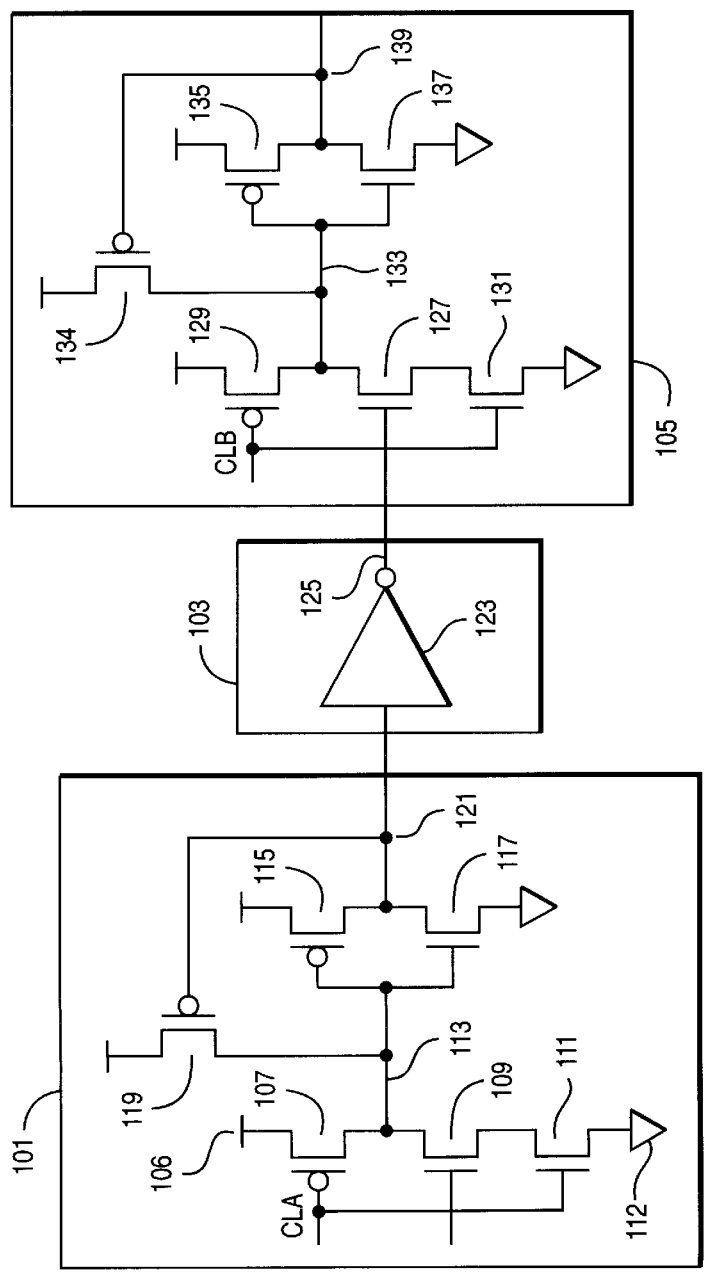

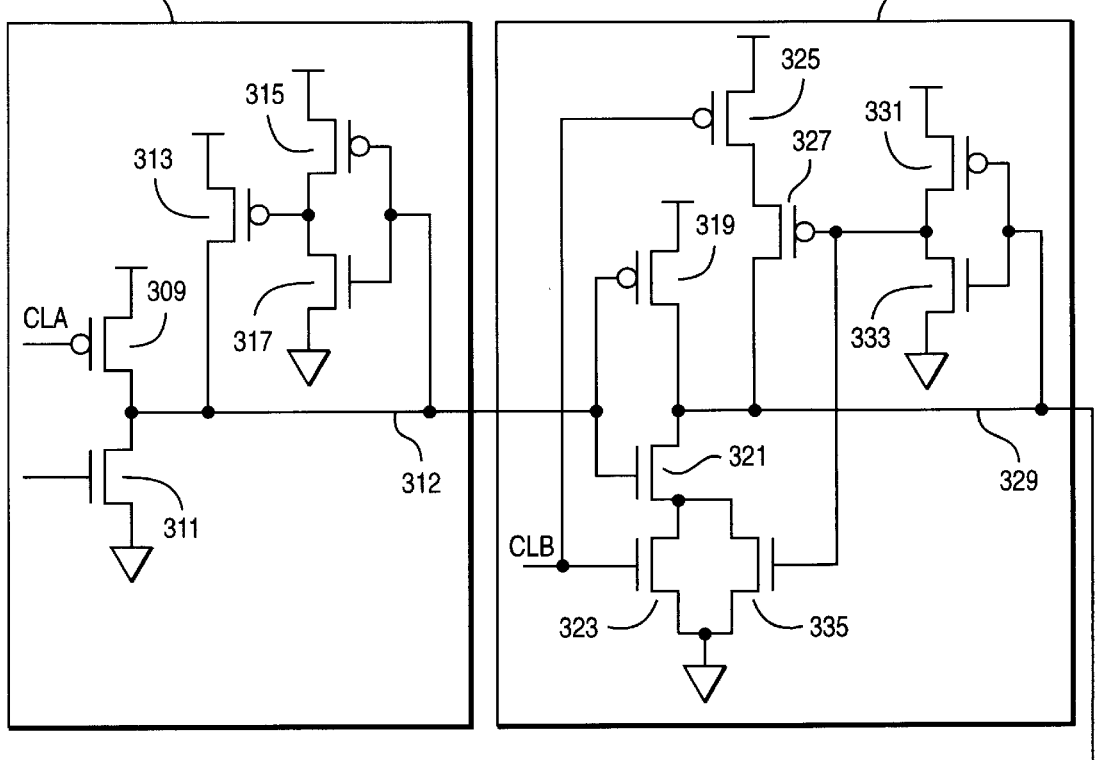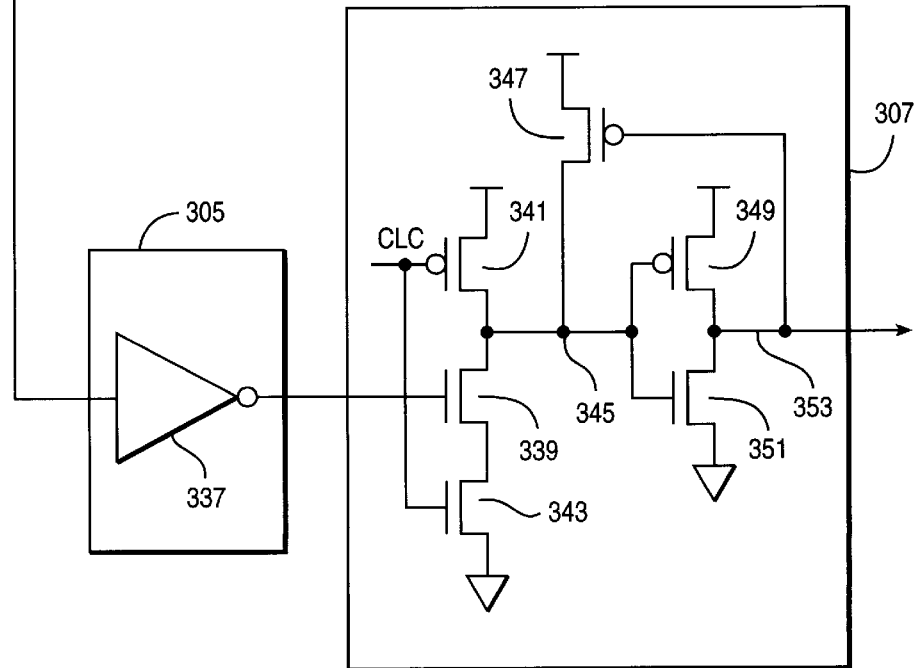
FIG. 3

| CLOCK CLA | CLOCK CLB | CLOCK CLC |
|---|---|---|
| Ci_dr | Ci_ | C2 |
| C2dr | C2 | Ci |
| Cidr | Ci | C1 |
| C1dr | C1 | Ci_ |

5,892,372

CREATING INVERSIONS IN RIPPLE DOMINO LOGIC

FIELD OF THE INVENTION

The present invention relates generally to digital signal logic circuitry and more particularly to the creation of inverting stages in ripple domino logic circuits.

BACKGROUND OF THE INVENTION

In general, the term "domino logic" is used to refer to an arrangement of logic circuit stages which may, for example, be cascaded together in an integrated circuit array configuration. A signal may be input to a first stage where it is evaluated in order to provide an output signal to a second stage where that output signal is again evaluated to provide an output signal for propagation to and evaluation by yet another stage in the circuit. Thus a "domino" effect is achieved whereby signals are sequentially propagated through an array of "stages" or "domino blocks", and each successive stage performs an evaluation of an input condition until a final output is provided at a final output stage.

Domino logic circuits may be arranged so that signals can propagate through the various stages without being separately clocked at each stage. Accordingly, a domino arrangement allows a signal to be processed through a relatively complex logic function during a single clock cycle. This ability of a domino circuit obviates the need for plural clock cycles to process the input signals, and also decreases the overall processing time of the logic function.

Further, domino logic arrangements have not been applicable to all logic implementations. For example, in MOS technology, a positive logic scheme cannot be maintained since a typical adder circuit requires the use of negative logic functions such as NAND, NOR and NOT functions. Typical MOS logic implementations are limited to positive or non-inverting logic schemes which use only positive functions such as AND gates and OR gates.

Perhaps the biggest disadvantage to domino logic is that it is not a complete logic family, i.e. it is not possible to construct all logic functions using only domino circuits or blocks. The problem is that domino logic, as hereinbefore explained, does not admit any inverting stages. Attempts to avoid this "inversion" problem by adding inverting stages to ordinary domino logic introduce signal race conditions which would not be present in a pure domino logic configuration. The term "race condition" characterizes a timing relation between two signals that must be met for the circuit to function correctly and reliably, and this race condition is not relaxed by slowing the clock frequency.

In the past, efforts have been made to overcome the inversion problem, but such efforts have not been totally successful. Such an example would be where the clock signal to the domino logic block is delayed in order to prevent the domino block from evaluating until the negative input to the block has stabilized. However, if the delay introduced in the clock is not large enough, a race condition is introduced and the circuit will fail to function properly and reliably, and any extra delay of the clock, which may be applied as a safety margin, will slow down the evaluation function of the circuit by an equal amount.

Thus, there is a need to provide an improved method and apparatus for the implementation of domino logic configurations which include inverting stages but which, at the same time do not introduce signal race conditions which may otherwise adversely affect the timing and reliability of the logic circuitry.

SUMMARY OF THE INVENTION

A method and implementation is provided by which inversions are created for domino circuits in order to accommodate and allow the use of negative logic elements for the processing of comprehensive logic functions. The clock timing signals within various domino circuit elements are mutually referenced and timed to enable a stable evaluation process to occur at the various logic stages, and simultaneously, to preclude the creation of signal racing conditions, through the use and application of various sets of unique timing signals.

BRIEF DESCRIPTION OF THE DRAWINGS

A better understanding of the present invention can be obtained when the following detailed description of a preferred embodiment is considered in conjunction with the following drawings, in which:

FIG. 1 is a schematic diagram of a domino logic circuit including two domino blocks and an inversion stage;

FIG. 2 is a table showing a ripple domino clock assignment which provides inversion without introducing race conditions;

FIG. 3 is a schematic diagram of an alternate domino logic configuration utilizing a latching element;

DETAILED DESCRIPTION OF A PREFERRED EMBODIMENT OF THE INVENTION

Figures 4, 5:
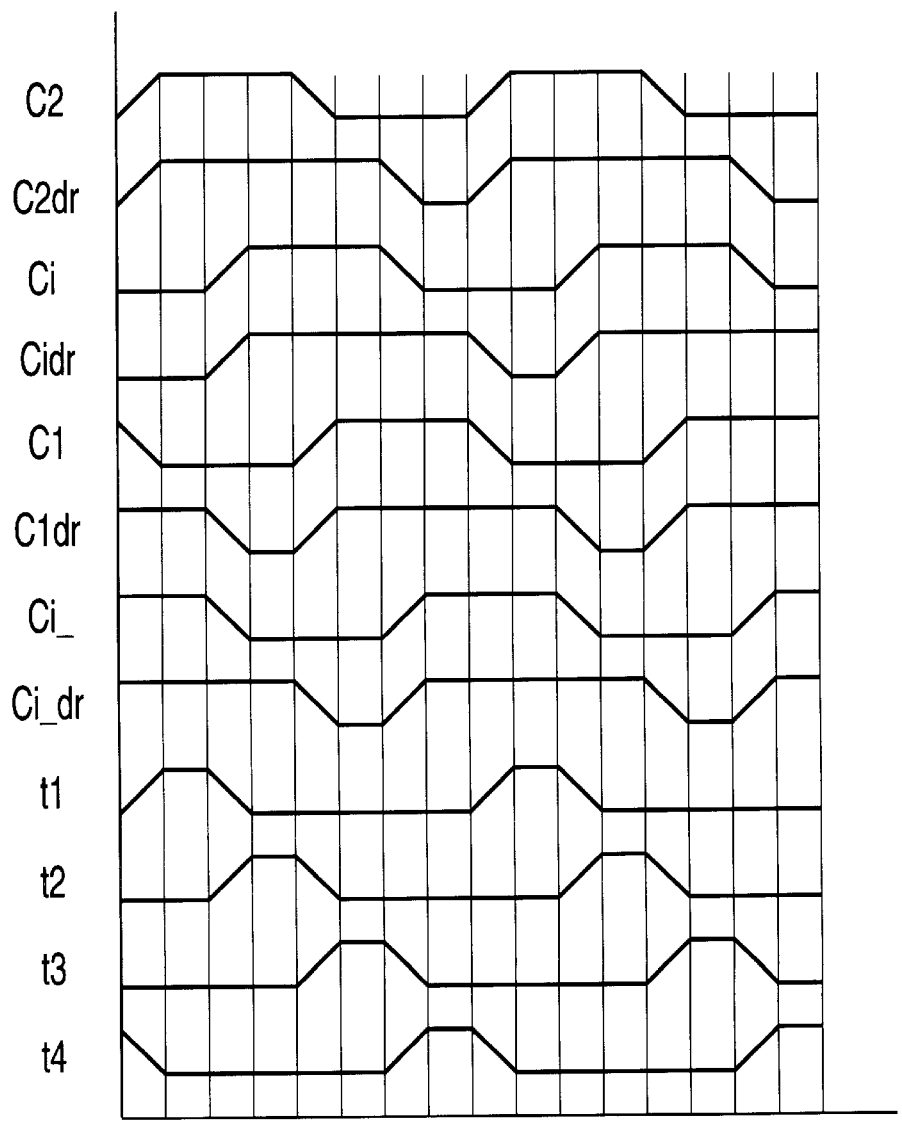
FIG. 4 is a table showing a ripple domino clock assignment for the FIG. 3 implementation.
FIG. 5 is a timing chart illustrating the relationships between the various sets of ripple domino clock signals.

Although the present disclosure shows isolated domino circuitry for the sake of simplicity, it is understood that the present invention is not limited to isolated logic implementations or logic array implementations but rather also includes systems in which the methodology taught herein is implemented within or as part of a single system CPU or other larger semiconductor system, chip, processor or integrated circuit.

In the present example, the terms "source" or "source potential" are used interchangeably to refer to a logic "1" or "high" level potential. Also the terms "zero level", "ground potential", or "ground" are also used interchangeably to refer to a logic "0" or "low" level potential. The logic "1" level and logic "0" level symbols shown in the drawings shall be hereinafter referred to as such although such symbols are not necessarily hereinafter numbered in the drawings in order to avoid obfuscating the other components of the drawings. Since domino circuits all go to a reset voltage at the start of a machine cycle, the voltages that correspond to logic "1" and logic "0" are taken to be those voltages that the circuits assume at the end of a machine cycle.

With reference to FIG. 1, there is shown a first domino logic block 101 having an output thereof applied through an inverter block 103 to a second domino logic circuit block 105. In the present example, domino blocks 101 and 105 are dynamic buffer circuits although the present invention would apply to other domino logic block circuits as well. The first domino block 101 receives a first clock signal CLA which is applied to a control terminal of a p-channel transistor 107. Transistor 107 is connected between a source potential or logic "1" voltage level 106 and a first node 113. Node 113 is connected through two n-channel transistors 109 and 111 to a logic "0" level voltage 112.

Transistor 111 receives the CLA clock signal to its gate or control terminal and transistor 109 is arranged to receive a data signal to be evaluated. Node 113, is connected to the source potential through a p-channel transistor 119 which receives its control signal from the output signal of the first domino block 101. Node 113 is also connected to a common point connected between the gate terminals of a p-channel transistor 115 and an n-channel transistor 117. Transistors 115 and 117 are connected in series between the source or logic "1" potential and the return or logic "0" potential. Node 121 is a common point between the output terminals of transistors 115 and 117. Node 121 is connected to the gate terminal of transistor 119 and also provides an output signal from the first domino block 101.

The inverter stage 103 includes an inverter circuit 123 which provides an inverter output signal through an inverter output node 125 to the second domino block 105. The second domino circuit or block 105 is a replica or duplicate of the first domino block 101. A p-channel transistor 129 connects a source potential bus 106 to a first nodal point 133 which in turn is connected through serially connected n-channel transistors 127 and 131 to the "0" potential bus 112. Transistor 127 receives its input from the inverter output node 125 and transistors 129 and 131 receive a second clock signal CLB at their input terminals. A p-channel "pull-up" transistor 134 connects the node 133 to the logic "1" bus 106. Node 133 is also connected to a common point connecting the input gates of a p-channel transistor 135 and an n-channel transistor 137. Transistors 135 and 137 are serially connected between the logic "1" bus 106 and the logic "0" bus 112. A common point 139 between the output terminals of transistors 135 and 137 is connected back to the gate terminal of "pull-up" transistor 134, and also provides the output from the second domino block circuit 105.

The ripple domino clock assignment that solves the inversion problem, without introducing race conditions is illustrated in FIG. 2 which shows the various combinations of the clock signals (FIG. 5) which may be used in the FIG. 1 circuit. Any combination of clocks on any one of the horizontal lines in the table shown in FIG. 2 may be implemented thereby allowing inversion across any quarter-cycle point. The two global clock signals CLA and CLB are distributed across the circuit or chip containing the domino array. The other clocks are created locally by any of various known methods including clock signal divider circuitry.

In operation, an input data signal to the gate terminal of transistor 109 is "evaluated" by the buffer circuit 101. Buffer circuit 101 is arranged to receive the first clock signal CLA. Node 113 is normally precharged to a logic 1 level through "pull-up" transistor 107. The node signal at node 113 is inverted by the operation of transistors 115 and 117 and inverted again through the operation of the inverter circuit 123. Each of those inversions introduces inherent associated gate delays into the data path of the domino logic circuit. The buffer 105 is a duplicate of buffer 101 but is arranged to receive a second clock signal CLB. In order to assure the integrity and reliability of the evaluation of block 105, the input node 125 must meet two timing relationships relative to its clock CLB.

In the first timing relationship, node 125 must evaluate (fall) prior to the rise of CLB, otherwise circuit 105 will evaluate when it should have remained in a precharge state. That is, if node 125 falls after the rise of CLB, then transistors 127 and 131 will conduct, thereby discharging node 133. That will cause transistor 135 to conduct pulling node 139 high. The present example assures that node 105 evaluates prior to the rise of CLB by requiring CLA to rise prior to the rise of CLB.

In the second timing relationship, node 125 must not precharge or rise until after the fall of CLB, otherwise this will cause the circuit 105 to evaluate when it should have remained in a precharge state by activating transistors 127 and 131 simultaneously. This is achieved by requiring the respective clock signals CLA and CLB to be implemented such that the first clock signal CLA will remain high at a logic 1 level until after the second clock signal CLB has fallen from a logic 1 level to a logic zero level. This is accomplished by timing the activation pulse of the second clock signal CLB to fall substantially in the middle of the activation pulse for the first clock signal CLA. The activation pulse or logic "1" time for the second clock signal CLB is also shortened to allow substantial safety margins on either side of the CLB activation pulse to avoid racing problems including any racing problems that may be introduced by the inclusion of the inverter circuit 123 and its associated gate delay.

As shown in FIG. 2, and with further reference to the timing signal chart shown in FIG. 5, there are various signal combinations that may be implemented to meet the above discussed signal timing criteria. In a first combination, as shown in FIG. 2, the first clock signal CLA may be implemented with a "Ci_dr" signal, and the second clock signal CLB can be of the form illustrated as the "t1" signal. As can be seen from the timing chart in FIG. 5, the activation or evaluate pulse for the t1 signal, i.e. the time at the logic 1 level, does not fall to an off level until a predetermined delay time past the activation or evaluate segment or pulse of the Ci_dr signal. There are also predetermined and measurable margins on both sides of the t1 evaluate segment within the Ci_dr evaluate segment, to guarantee that the CLA signal (Ci_dr) will remain high until well after the CLB signal (t1) goes low. That relationship, in turn, assures that the logic evaluations will occur during a period when the data signals have been stabilized, even allowing for the delay that is introduced by the inverter 123. Similar timing and duration relationships exist the other signal sets shown in FIG. 2, viz. between signals "C2dr" and "t2", "Cidr" and "t3", and "C1dr" and "t4".

As an alternative approach to the FIG. 1 embodiment, a latch domino implementation, which does not require quartercycle clocks, is shown in FIG. 3. In FIG. 3, a first domino block 301 is connected to a latching element block 303 which is, in turn, connected through an inverter 305 to another domino block circuit 307. Domino circuit 307 is a duplicate of the first domino block 301. The first domino circuit 301 includes a p-channel transistor 309 serially connected with an n-channel transistor 311 between the logic "1" bus and the logic "0" bus. Transistor 309 receives a clock signal CLA at its input terminal and the gate terminal of transistor 311 is arranged to receive a data input signal to be evaluated. The common point between transistors 309 and 311 is connected to a node 312 which is, in turn, connected through a "pull-up" p-channel transistor 313 to the logic "1" level supply bus. P-channel transistor 315 is serially connected with n-channel transistor 317 between the logic "1" potential and the logic "0" potential or ground. The gate terminals of transistors 315 and 317 are connected together and to the first domino block output node 312.

Node 312 provides an input to the latching element or block 303. Node 312 is connected to a common point connecting the gate terminals of n-channel transistor 321 and p-channel transistor 319. Transistor 319 is connected in series with transistor 321 and a third transistor 323 between the source potential and ground. A common point between the outputs of transistors 319 and 321 is connected to a latchoutput mode 329. A fourth transistor 325 (p-channel) and a fifth transistor 327 (p-channel) are connected in series between the source potential and the latch output node 329. The gate terminal of transistor 325 is arranged to receive a clock signal CLB which is also applied to the gate terminal of transistor 323. The gate terminal of transistor 335 is connected to the gate terminal of transistor 327 which, in turn is connected to a common point between series connected transistors 331 and 333. P-channel transistor 331 and n-channel transistor 333 are connected between the source and ground potentials. The gate terminals of transistors 331 and 333 are connected together and to the latch output node 329.

The latching element 303 provide an output signal at node 329 which is applied to the inverter element or block 305. The inverter element 305 includes an inverter circuit 337 which provides an inverter output signal to a second domino block or domino circuit 307. The output from the inverter 337 is applied as an input to a gate terminal of an n-channel transistor 339 as the input to domino block 307. P-channel transistor 341 connects one output terminal of transistor 339 to the source potential and n-channel transistor 343 connects the other output terminal of transistor 339 to the ground potential. Transistors 341 and 343 are arranged to receive a clock signal CLC as an input applied to the gate terminals thereof. A common point or node 345 between serially connected transistors 339 and 341 is connected through a p-channel "pull-up" transistor 347 to the source potential. Node 345 is also connected to a common point connected between the gate terminals of p-channel transistor 349 and n-channel transistor 351. Transistors 349 and 351 are connected in series between the source or logic "1" level potential and the ground or logic "0" level voltage. A common point between the outputs of transistors 349 and 351 is connected to an output node 353 which provides an output signal from the second domino block 307. Output node 353 is also connected to the gate terminal of a "pull-up" transistor 347.

FIG. 4 illustrates the various combinations of the clock signals CLA, CLB, and CLC, which may be used in the FIG. 3 circuit in order to provide inversion without creating signal racing problems. Any combination of clocks on any one of the lines in the table shown in FIG. 4 may be implemented. For example, one of the sets of clock signals which may be applied in the FIG. 3 configuration includes the "Ci_dr" signal for the first clock signal "CLA", the "Ci_" signal for the second clock signal "CLB", and the "C2" signal for the third clock signal "CLC". The timing relationships between those signals is shown in FIG. 5. It can be seen that the circuitry of the FIG. 3 implementation, and the signal relationships between the clock signals applied in FIG. 3, result in an assured condition that there has been a stabilization of data and circuit switching before logic evaluations can occur. Similar signal relationships are present with respect to the other three sets of clock signals shown in FIG. 4.

The method and apparatus of the present invention has been described in connection with a preferred embodiment as disclosed herein. Although an embodiment of the present invention has been shown and described in detail herein, along with certain variants thereof, many other varied embodiments that incorporate the teachings of the invention may be easily constructed by those skilled in the art. Accordingly, the present invention is not intended to be limited to the specific form set forth herein, but on the contrary, it is intended to cover such alternatives, modifications, and equivalents, as can be reasonably included within the spirit and scope of the invention.

What is claimed is:

1. A method for clocking an operation of a domino circuit configuration, said method comprising:

applying a first clock signal to a first domino circuit, said first clock signal comprising an evaluate segment and an off segment, said evaluate segment of said first clock signal being effective to initiate a circuit evaluation of a first input signal by said first domino circuit to produce a first evaluation output signal;

applying a second clock signal to a second domino circuit, said second clock signal comprising an evaluate segment and an off segment, said evaluate segment of said second clock signal being effective to initiate a circuit evaluation of the first evaluation output signal from said first domino circuit by said second domino circuit; and, after said first clock signal has transitioned to the evaluate segment, delaying the termination of the first evaluation output signal to a point in time past the evaluate segment of said second clock signal, said termination of the first evaluation output signal being delayed past the evaluate segment of said second clock signal by a predetermined stabilization delay time.

2. The method as set forth in claim 1 wherein said domino circuit configuration further includes an inverter circuit connected between said first domino circuit and said second domino circuits.

3. The method as set forth in claim 1 wherein said delaying is accomplished by providing independent first and second clock signals.

4. The method as set forth in claim 1 wherein said delaying is accomplished by latching the first evaluation output signal with a latch circuit associated with said first domino circuit.

5. A domino circuit configuration comprising:

a first domino circuit, said first domino circuit being arranged to receive a data input signal and a first clock signal, and providing a first domino output signal;

an inverter circuit connected to said first domino circuit, said inverter circuit being arranged for receiving said first domino output signal and outputting an inverter output signal; and a second domino circuit, said second domino circuit being connected to said inverter circuit, said second domino circuit being arranged for receiving said inverter output signal and a second clock signal, said first clock signal comprising an evaluate segment and an off segment, said evaluate segment of said first clock signal being effective to initiate a circuit evaluation of said data input signal by said first domino circuit, said second clock signal comprising an evaluate segment and an off segment, said evaluate segment of said second clock signal being effective to initiate a circuit evaluation of said inverter output signal by said second domino circuit, said evaluate segment of said first clock signal being terminated past said evaluate segment of said second clock signal by a stabilization delay time, whereby said second domino circuit is prevented from evaluating a signal applied from said inverter circuit until a predetermined period of time following an evaluation operation by said first domino circuit has been completed and data signals resulting from said evaluation operation have stabilized.

6. The domino circuit configuration as set forth in claim 5 wherein said first domino circuit is comprised of a first dynamic buffer circuit.

7. The domino circuit configuration as set forth in claim 6 wherein said second domino circuit is comprised of a second dynamic buffer circuit.

8. A domino circuit configuration comprising:

a first domino circuit, said first domino circuit being arranged to receive a data input signal and a first clock signal, said first domino circuit being selectively operable for evaluating said data input signal and providing a first domino output signal representative of said evaluation by said first domino circuit;

a second domino circuit, said second domino circuit being coupled to said first domino circuit, said second domino circuit being arranged to receive said first domino output signal and a second clock signal, said second domino circuit being selectively operable for evaluating said first domino output signal and providing a second domino output signal representative of said evaluation by said second domino circuit;

an inverter circuit connected to said second domino circuit, said inverter circuit being arranged for receiving said second domino output signal and outputting an inverter output signal; and a third domino circuit, said third domino circuit being coupled to said inverter circuit, said third domino circuit being arranged for receiving said inverter output signal and a third clock signal, said third domino circuit being selectively operable for evaluating said inverter output signal and providing a third domino output signal representative of said evaluation by said third domino circuit, said domino circuit configuration including evaluation timing means, said evaluation timing means being effective for holding evaluation values generated by any of said first, second and third domino circuits until after evaluation cycles for subsequent domino circuits have been initiated.

9. The domino circuit configuration as set forth in claim 8 wherein said first domino circuit comprises an inverting buffer.

10. The domino circuit configuration as set forth in claim 9 wherein said first domino circuit further includes latching circuitry effective for holding evaluation values generated by said first domino circuit until after said evaluation cycle for said second domino circuit has been initiated.

11. The domino circuit configuration as set forth in claim 8 wherein said second domino circuit comprises an inverting buffer.

12. The domino circuit configuration as set forth in claim 11 wherein said second domino circuit further includes latching circuitry effective for holding evaluation values generated by said second domino circuit until after evaluation cycle for said third domino circuit has been initiated.

13. The domino circuit configuration as set forth in claim 8 wherein said third domino circuit comprises a non-inverting buffer.

14. The domino circuit configuration as set forth in claim 8 wherein said first domino circuit includes an inverting buffer, said first domino circuit further including latching circuitry effective for holding evaluation values generated by said first domino circuit until after said evaluation cycle for said second domino circuit has been initiated, said second domino circuit comprising an inverting buffer, said second domino circuit further including latching circuitry effective for holding evaluation values generated by said second domino circuit until after evaluation cycle for said third domino circuit has been initiated, and said third domino circuit comprising a non-inverting buffer.

15. A method for clocking first and second circuitry, said method comprising:

applying to first circuitry a first clock signal having an evaluation segment for initiating evaluation of an input signal by said first circuitry;

applying to second circuitry a second clock signal having an evaluation segment for initiating evaluation of an output signal from the first circuitry, said first clock signal evaluation segment being applied for a predetermined stabilization time before the evaluation segment of the second clock signal and being terminated after a corresponding termination of said second clock signal evaluation segment.

16. A circuit configuration comprising:

a first circuit, said first circuit being arranged to receive a data input signal and a first clock signal, and providing a first output signal;

an inverter circuit connected to said first circuit, said inverter circuit being arranged for receiving said first output signal and outputting an inverter output signal; and a second circuit, said second circuit being connected to said inverter circuit, said second circuit being arranged for receiving said inverter output signal and a second clock signal, said first clock signal comprising an evaluate segment and an off segment, said evaluate segment of said first clock signal being effective to initiate a circuit evaluation of said data input signal by said first circuit, said second clock signal comprising an evaluate segment and an off segment, said evaluate segment of said second clock signal being effective to initiate a circuit evaluation of said inverter output signal by said second circuit, said evaluate segment of said first clock signal being terminated past said evaluate segment of said second clock signal by a stabilization delay time, whereby said second circuit is prevented from evaluating a signal applied from said inverter circuit until a predetermined period of time following a time when an evaluation operation by said first circuit has been completed and data signals resulting from said evaluation operation have stabilized.

17. A circuit configuration comprising:

a first circuit, said first circuit being arranged to receive a data input signal and a first clock signal, said first circuit being selectively operable for evaluating said data input signal and providing a first output signal representative of said evaluation by said first circuit;

a second circuit, said second circuit being coupled to said first circuit, said second circuit being arranged to receive said first output signal and a second clock signal, said second circuit being selectively operable for evaluating said first output signal and providing a second output signal representative of said evaluation by said second circuit;

an inverter circuit connected to said second circuit, said inverter circuit being arranged for receiving said second output signal and outputting an inverter output signal; and a third circuit, said third circuit being coupled to said inverter circuit, said third circuit being arranged for receiving said inverter output signal and a third clock signal, said third circuit being selectively operable for evaluating said inverter output signal and providing a third output signal representative of said evaluation by said third circuit, said circuit configuration including evaluation timing means, said evaluation timing means being effective for holding evaluation values generated by any of said first, second and third circuits until after evaluation cycles for subsequent circuits have been initiated.

* * * * *